(12) United States Patent
Falk et al.

(10) Patent No.: US 12,332,538 B2
(45) Date of Patent: Jun. 17, 2025

(54) DUAL-SUPERCONDUCTOR QUANTUM TRANSDUCER

(71) Applicant: International Business Machines Corporation, Armonk, NY (US)

(72) Inventors: Abram L Falk, Port Chester, NY (US); Chi Xiong, Yorktown Heights, NY (US); Swetha Kamlapurkar, Yorktown Heights, NY (US); Jason S. Orcutt, Katonah, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 999 days.

(21) Appl. No.: 17/384,159

(22) Filed: Jul. 23, 2021

(65) Prior Publication Data

US 2024/0337896 A1    Oct. 10, 2024

(51) Int. Cl.
*G02F 1/35* (2006.01)
*G02F 1/355* (2006.01)
(Continued)

(52) U.S. Cl.
CPC .......... *G02F 1/3507* (2021.01); *G02F 1/3503* (2021.01); *G02F 1/3534* (2013.01);
(Continued)

(58) Field of Classification Search
CPC .... G02F 1/3507; G02F 1/3503; G02F 1/3534; G02F 1/355; H10N 60/82; H10N 60/85; G06N 10/40; H01P 7/082
See application file for complete search history.

(56) References Cited

U.S. PATENT DOCUMENTS

| 4,879,533 A | 11/1989 | de Muro et al. |
| 6,066,598 A | 5/2000 | Ishikawa et al. |

(Continued)

FOREIGN PATENT DOCUMENTS

| CN | 106646738 A | 5/2017 |
| DE | 112017001164 T5 | 11/2018 |

(Continued)

OTHER PUBLICATIONS

Notice of Allowance received for U.S. Appl. No. 17/191,275, dated Sep. 9, 2024, 6 pages.
Examination Report No. 1 received for Australian Patent Application Serial No. 2022229739 dated Jul. 15, 2024, 3 pages.
McKenna et al. | Cryogenic microwave-to-optical conversion using a triply resonant lithium-niobate-on-sapphire transducer. Optica. vol. 7, No. 12, Dec. 2020, 9 pages. https://doi.org/10.1364/OPTICA. 397235.

(Continued)

*Primary Examiner* — Anne M Hines
*Assistant Examiner* — Jose M Diaz
(74) *Attorney, Agent, or Firm* — Amin, Turocy & Watson, LLP (57) ABSTRACT

Techniques regarding quantum transducers are provided. For example, one or more embodiments described herein can include an apparatus that can comprise a superconducting microwave resonator having a microstrip architecture that can include a dielectric substrate positioned between a superconducting waveguide and a superconducting ground plane. The superconducting waveguide can have a first material composition. Also, the superconducting ground plane can have a second material composition that is distinct from the first material composition. Further, an optical resonator can be arranged with the dielectric substrate.

20 Claims, 10 Drawing Sheets

(51) Int. Cl.
  *G06N 10/40* (2022.01)
  *H01P 7/08* (2006.01)
  *H10N 60/82* (2023.01)
  *H10N 60/85* (2023.01)

(52) U.S. Cl.
  CPC .............. *G02F 1/355* (2013.01); *H10N 60/82* (2023.02); *H10N 60/85* (2023.02); *G06N 10/40* (2022.01); *H01P 7/082* (2013.01)

(56) References Cited

U.S. PATENT DOCUMENTS

| | | | |
|---|---|---|---|
| 6,187,717 | B1 | 2/2001 | Wikborg et al. |
| 6,678,540 | B2 | 1/2004 | Wire et al. |
| 6,734,638 | B2 | 5/2004 | Kang et al. |
| 6,920,253 | B2 | 7/2005 | Tan et al. |
| 7,889,992 | B1 | 2/2011 | DiVincenzo et al. |
| 7,941,014 | B1 | 5/2011 | Watts et al. |
| 8,447,145 | B2 | 5/2013 | Goldring et al. |
| 9,260,289 | B2 | 2/2016 | Park |
| 9,270,385 | B2 | 2/2016 | Meyers et al. |
| 9,296,609 | B2 | 3/2016 | Park |
| 9,350,460 | B2 | 5/2016 | Paik |
| 9,454,061 | B1 | 9/2016 | Abdo et al. |
| 9,660,721 | B2 | 5/2017 | Polzik et al. |
| 9,857,609 | B2 | 1/2018 | Bishop et al. |
| 9,885,888 | B2 | 2/2018 | Bishop et al. |
| 9,922,289 | B2 | 3/2018 | Abdo |
| 9,927,636 | B2 | 3/2018 | Bishop et al. |
| 10,295,582 | B2 | 5/2019 | Bishop et al. |
| 10,446,700 | B2 | 10/2019 | Wang et al. |
| 10,578,891 | B1 | 3/2020 | Schmeing et al. |
| 10,672,971 | B2 | 6/2020 | Brink et al. |
| 10,782,590 | B2 | 9/2020 | Witmer et al. |
| 10,858,240 | B2 | 12/2020 | Painter et al. |
| 2003/0057840 | A1 | 3/2003 | Kang et al. |
| 2005/0074194 | A1 | 4/2005 | Tan et al. |
| 2008/0310463 | A1 | 12/2008 | Maleki et al. |
| 2014/0314419 | A1 | 10/2014 | Paik |
| 2015/0055961 | A1 | 2/2015 | Meyers et al. |
| 2015/0060756 | A1 | 3/2015 | Park |
| 2017/0148972 | A1 | 5/2017 | Thompson et al. |
| 2017/0227795 | A1 | 8/2017 | Bishop et al. |
| 2017/0248832 | A1 | 8/2017 | Kippenberg et al. |
| 2017/0261770 | A1 | 9/2017 | Bishop et al. |
| 2017/0261771 | A1 | 9/2017 | Bishop et al. |
| 2018/0003753 | A1 | 1/2018 | Bishop et al. |
| 2018/0101787 | A1 | 4/2018 | Abdo |
| 2018/0113373 | A1 | 4/2018 | Witmer et al. |
| 2018/0247974 | A1 | 8/2018 | Oliver et al. |
| 2019/0043919 | A1 | 2/2019 | George et al. |
| 2019/0067779 | A1 | 2/2019 | U-Yen et al. |
| 2019/0147359 | A1 | 5/2019 | Chen et al. |
| 2019/0296210 | A1 | 9/2019 | Brink et al. |
| 2020/0321506 | A1 | 10/2020 | Kelly et al. |
| 2022/0146905 | A1 | 5/2022 | Falk et al. |

FOREIGN PATENT DOCUMENTS

| | | | |
|---|---|---|---|
| EP | 0 735 606 B1 | | 1/2002 |
| EP | 094 998 B1 | | 4/2019 |
| WO | 2017015432 | * | 1/2017 |
| WO | 2017/131831 A2 | | 8/2017 |
| WO | 2018002770 A1 | | 1/2018 |
| WO | 2019/213140 A1 | | 11/2019 |
| WO | 202018095 A1 | | 1/2020 |
| WO | 2020180956 A1 | | 9/2020 |

OTHER PUBLICATIONS

Witmer et al. | A silicon-organic hybrid platform for quantum microwave-to-optical transduction. Cornell University, Quantum Physics, Dec. 21, 2019, 31 pages. http://arxiv.org/abs/1912.10346.
Holzgrafe et al. | Cavity electro-optics in thin-film lithium niobate for efficient microwave-to-optical transduction. Cornell University, Quantum Physics, May 12, 2020, 19 pages. arXiv:2005.00939v2.
Orcutt et al. | Engineering electro-optics in SiGe/Si waveguides for quantum transduction. Quantum Sci. Technol., vol. 5, No. 3, 034006, May 5, 2020, 14 pages. https://iopscience.iop.org/article/10.1088/2058-9565/ab84c1/pdf.
Lu et al, "Schottky diodes from asymmetric metal-nanotube contacts," Appl Phys Lett 88, 133501 (2006), DOI:10.1063/1.2190707, 4 pages.
Bullock et al, "Effcient silicon solar cells with dopant-free asymmetric heterocontacts," Nature Energy 1, 15031 (2016), 7 pages.
Rabbani, et al, "Photoresponse of silicon with asymmetric area contacts," Semiconductor Sci. Techn. 32, 015001 (2016), 7 pages.
Xiong et al, "Microwave-To-Optical Quantum Transducers", U.S. Appl. No. 17/191,178, filed Mar. 3, 2021, 39 pages.
Falk et al, "Quantum Transducers With Embedded Optical Resonators," U.S. Appl. No. 17/191,275, filed Mar. 3, 2021, 32 pages.
Falk et al, "Active Electro-Optic Quantum Transducers Comprising Resonators With Switchable Nonlinearities," U.S. Appl. No. 17/094,365, filed Nov. 10, 2020, 45 pages.
Konaka et al., "Characteristics of microwave planar transmission lines using superconducting oxide films", Electronics and Communications in Japan (Part II: Electronics), vol. 75, No. 8, Aug. 1, 1992, pp. 83-94.
International Search Report and Written Opinion received for PCT Application Serial No. PCT/EP2022/054847 dated Jul. 7, 2022, 14 pages.
Tsioutsios et al., "Free-standing silicon shadow masks for transmon qubit fabrication", arxiv.org, Cornell University Library, 201 Olin Library Cornell University Ithaca, NY 14853, Aug. 16, 2020, doi: 10.1063/1.5138953, 8 pages.
Non-Final Office action received for U.S. Appl. No. 17/191,275, dated Aug. 1, 2023, 38 pages.
Mirhosseini, et al. "Superconducting qubit to optical photon transduction." Nature 588.7839 (2020): 599-603.
Xu, et al. "Bidirectional electro-optic conversion reaching 1% efficiency with thin-film lithium niobate." arXiv preprint arXiv:2012.14909 (2020).
Orcutt, et al, "Engineering electro-optics in SiGe/Si waveguides for quantum transduction," Quant. Sci. Tech, 5, 034006 (2020).
Gentry, et al. "Monolithic source of entangled photons with integrated pump rejection." CLEO: Applications and Technology. Optical Society of America, 2018.
Andrews, et al., "Bidirectional and efficient conversion between microwave and optical light," arXiv:1310.5276v2 [physics.optics] Aug. 11, 2014, 17 pages.
Ex Parte Quayle Office Action received for U.S. Appl. No. 17/191,178, dated Dec. 2, 2022, 52 pages.
Notice of Allowance received for U.S. Appl. No. 17/191,178, dated Mar. 1, 2023, 16 pages.
Ex Parte Quayle Action received for U.S. Appl. No. 17/191,275, dated Jan. 24, 2024, 13 pages.
Notice of Allowance received for U.S. Appl. No. 17/191,275, dated Mar. 6, 2024, 24 pages.
Australian Government, Notice of Acceptance for Patent Application for AU2022229739, Jan. 7, 2025, 3 pages.

* cited by examiner

DUAL-SUPERCONDUCTOR QUANTUM TRANSDUCER

STATEMENT REGARDING FEDERALLY SPONSORED RESEARCH OR DEVELOPMENT

This invention was made with Government support under W911NF-18-1-0022 awarded by Army Research Office (ARO). The Government has certain rights in this invention.

BACKGROUND

The subject disclosure relates to one or more quantum transducers with dual superconductors arranged in microstrip and/or co-planar architectures, and more specifically, to quantum transducer architectures that include one or more optical resonators positioned adjacent to dual superconducting microwave resonators and/or within a dielectric substrate.

Long-distance networks of superconducting quantum computers can involve quantum transducers that convert single photons from microwave frequencies up to the infrared telecom domain. The energy of a microwave photon is less than the thermal background energy of room temperature; therefore, room-temperature quantum information links at microwave frequencies can be extremely challenging. However, infrared photons can travel long distances in optical fibers without attenuation or interference. Quantum transducers linked to other superconducting quantum processors can then convert the photon from the infrared back to the microwave domain.

There are several approaches to this problem. One is to use a mechanical resonator as a mediating degree of freedom between the microwave and optical domains. Others leverage the optical or spin transitions of atoms or solid-state defect centers, or magnon states. However, the present inventors have observed that mechanical resonators may suffer from low overall transduction efficiencies and/or transduction bandwidth, and that various coupled optical and microwave resonators may suffer from unwanted effects of pre-breakdown currents.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, apparatus, systems, devices, and/or methods regarding quantum transducers are described.

According to an embodiment, an apparatus is provided. The apparatus can comprise a superconducting microwave resonator having a microstrip architecture that can include a dielectric substrate positioned between a superconducting waveguide and a superconducting ground plane. The superconducting waveguide can have a first material composition. Also, the superconducting ground plane can have a second material composition that is distinct from the first material composition. Further, the apparatus can comprise an optical resonator arranged with the dielectric substrate. In some examples, the superconducting waveguide and the superconducting ground plane are electrically connected to a direct current voltage supply. An advantage of such an apparatus can be the use of effective $\chi^{(2)}$ non-linearities in optical resonators comprising $\chi^{(3)}$ medium.

According to an embodiment, another apparatus is provided. The apparatus can comprise a superconducting microwave resonator having a co-planar waveguide architecture that can include a superconducting waveguide and a superconducting ground plane positioned on a dielectric substrate. The superconducting waveguide can have a first material composition. Also, the superconducting ground plane can have a second material composition that is distinct from the first material composition Further, the apparatus can comprise an optical resonator arranged with the dielectric substrate. In some examples, the dielectric substrate can comprise at least one element selected from the group consisting of silicon, sapphire, and garnet. An advantage of such an apparatus can be a wider range of voltage values that can be applied to a quantum transduce while minimizing transported current.

According to an embodiment, another apparatus is provided. The apparatus can comprise a superconducting microwave resonator that can include a superconducting waveguide and a superconducting ground plane. The superconducting waveguide can have a first work function. Also, the superconducting ground plane can have a second work function that is distinct from the first work function. Further, the apparatus can comprise an optical resonator arranged with a dielectric substrate. The dielectric substrate can be positioned between the optical resonator and the superconducting waveguide. In some examples, the superconducting waveguide can comprise niobium nitride, and the superconducting ground plane can comprise niobium. An advantage of such an apparatus can be the achievement of a desired electrical field in one or more superconductor-dielectric junctions of a quantum transducer despite the application of zero voltage.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Various embodiments described herein can include apparatus, devices, systems, and/or systems regarding one or more quantum transducers that can rely on electro-optic coupling between one or more microwave resonator architectures and one or more optical resonators. In one or more embodiments, the one or more microwave resonator architectures can comprise one or more superconducting waveguides and superconducting ground planes arranged in a microstrip and/or co-planar waveguide structure. Further, the one or more superconducting waveguides can comprise a different work function metal than the one or more superconducting ground planes. In various embodiments, the one or more optical resonators can comprise a centrosymmetric $\chi^{(3)}$ tensor material operatively coupled to a DC voltage. Application of the DC voltage can render the optical resonator an effective $\chi^{(2)}$; thereby inducing effective $\chi^{(2)}$ non-linearities in a $\chi^{(3)}$ material. Where the work functions of the one or more superconducting waveguides and the one or more superconducting ground planes are sufficiently mismatched, then both metal-dielectric junctions can be reverse biased at the same time without doping the dielectric.

In various embodiments, a quantum transducer can comprise a superconducting microwave resonator architecture having at least two distinct superconducting metals with at least two distinct work functions. As used herein, the term "work function" can refer to the minimum energy needed to remove an electron from a solid to the vacuum immediately outside that solid. Work function can also be the difference in energy between the Fermi energy of the solid and the product of the electrostatic potential of the vacuum and the charge of an electron. Further, the superconducting resonator architecture can be coupled to an optical resonator comprising a $\chi^{(3)}$ medium. The superconducting microwave resonator architecture can be operatively coupled to a DC voltage supply. Applying a voltage to the superconducting resonator architecture can create an electric field across the optical resonator and render an effective $\chi^{(2)}$ non-linearity. The superconducting microwave resonator architecture can be structured as a microstrip or a co-planar waveguide, embodied as two back-to-back metal-dielectric Schottky diodes. At least because the superconducting metals of the superconducting microwave resonator have distinct work functions, both of the Schottky diodes can be reverse biased simultaneously. Also, the distinct metal work functions can enable an electric field that renders the effective $\chi^{(2)}$ non-linearity without a bias. In various embodiments, an optical waveguide can be pumped with a pump laser; thereby a single microwave photon can be fed into the superconducting microwave resonator architecture, where the photon can be up-converted to an optical photon in the optical resonator via the effective $\chi^{(2)}$ non-linearity. Alternatively, the optical waveguide can be pumped with a pump laser; thereby a single optical photon can be fed into the optical resonator, where the photon is down-converted to a microwave photon in the superconducting microwave resonator architecture via the effective $\chi^{(2)}$ non-linearity.

As described herein, the terms "epitaxial growth process" and/or "epitaxial growth processes" can refer to any process that grows an epitaxial material (e.g., a crystalline semiconductor material) on a deposition surface of another semiconductor material, in which the epitaxial material being grown has substantially the same crystalline characteristics as the semiconductor material of the deposition surface. In an epitaxial deposition process, chemical reactants provided by source gases (e.g., a silicon and/or germanium containing gas) and/or source liquids can be controlled, and the system parameters can be set, so that the depositing atoms arrive at the deposition surface with sufficient energy to move about on the surface and orient themselves to the crystal arrangement of the atoms of the deposition surface. Therefore, the grown epitaxial material has substantially the same crystalline characteristics as the deposition surface on which the epitaxial material is formed. For example, an epitaxially grown semiconductor material deposited on a <100> orientated crystalline surface can take on a <100> orientation. Example epitaxial growth processes can include, but are not limited to: vapor-phase epitaxy ("VPE"), molecular-beam epitaxy ("MBE"), liquid-phase epitaxy ("LPE"), a combination thereof, and/or the like.

As described herein the term "superconducting" can characterize a material that exhibits superconducting properties at or below a superconducting critical temperature, such as aluminum (e.g., superconducting critical temperature of 1.2 Kelvin) or niobium (e.g., superconducting critical temperature of 9.3 Kelvin). Additionally, one of ordinary skill in the art will recognize that other superconductor materials (e.g., hydride superconductors, such as lithium/magnesium hydride alloys) can be used in the various embodiments described herein.

As noted above, transducers involving optical and microwave resonators can have certain deficiencies. If optical and microwave resonators are coupled through a $\chi^{(2)}$ or $\chi^{(3)}$ non-linear optical medium, then the microwave and optical resonators can directly exchange energy without the need for a mediating degree of freedom. However, if the optical medium has a non-zero $\chi^{(2)}$, then up-conversions or down-conversions can occur via three-wave mixing, whereby a single microwave, or optical, photon can mix with an optical pump to be up-converted, or down-converted, to the optical, or microwave, domain. For centrosymmetric materials (e.g., characterized by a $\chi^{(2)}=0$), a $\chi^{(3)}$ tensor can be employed, which can rely on the mixing of four electromagnetic fields. Further, a direct current ("DC") voltage can be substituted for one of the four electromagnetic fields to render an effective $\chi^{(2)}$ tensor.

However, in order to induce an effective $\chi^{(2)}$ tensor in $\chi^{(3)}$ medium with a DC voltage, care must be taken in designing metal contacts to the medium that allow a large voltage to be sustained across it while minimizing the current passing through. The maximum voltage that can be sustained across a dielectric is constrained by the dielectric breakdown field. Further, a variety of pre-breakdown currents can also exist, including: Zener tunneling, thermionic currents, field-assisted tunneling, and minority-carrier injection. The pre-breakdown currents can be problematic in a symmetric metal-semiconductor-metal device, such as a microwave resonator in which the two metals are the same material. The resistance in this type of device can be understood as deriving from two back-to-back Schottky barriers. When a voltage is applied across the device, one of the Schottky barriers is raised (put into reverse bias) while the other one is lowered (put into forward bias).

Typical semiconductor device architectures can dope a dielectric into a p-type/intrinsic/n-type structure, whereby the correct polarity of voltage across the device can put both junctions into reverse bias. Yet, superconducting microwave resonators comprised in quantum transducers can be employed in cryogenic temperatures, where non-degenerate doping can be ineffective and degenerately doped junctions can introduce loss that impacts the performance of the quantum transducer. Exemplary quantum transducers involving microwave and optical resonators and superconducting materials are disclosed herein.

Figure 1:
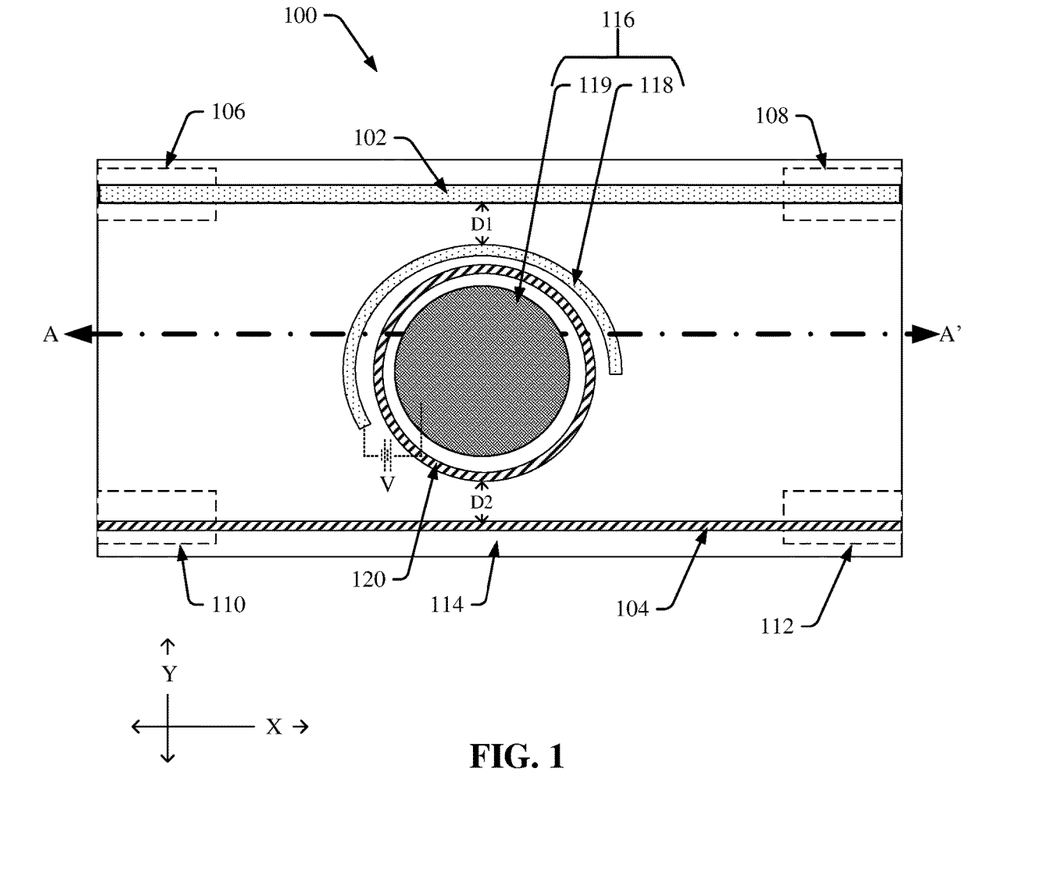
FIG. 1 illustrates a diagram of an example, non-limiting top-down view of a quantum transducer in accordance with one or more embodiments described herein.

FIG. 1 illustrates a diagram of an example, non-limiting top-down view of an exemplary quantum transducer 100 in accordance with one or more embodiments described herein. Repetitive description of like elements employed in other embodiments described herein is omitted for the sake of brevity. In various embodiments, the quantum transducer 100 can include one or more microwave transmission lines 102 and/or one or more optical waveguides 104. The one or more microwave transmission lines 102 can extend from, for example, a microwave input section, for example single microwave photon input section 106, to a microwave output section, for example single microwave photon output section 108. Similarly, the one or more optical waveguide 104 can extend from, for example, an optical input section, for example single optical photon input section 110 (e.g., coupled to a pump laser input), to an optical output section, for example single optical photon output section 112.

In one or more embodiments, the one or more microwave transmission lines 102 can comprise one or more superconducting materials. Example superconducting materials that can be comprised within the one or more microwave transmission lines 102 can include, but are not limited to: niobium, niobium nitride, titanium nitride, a combination thereof, and/or the like. The one or more microwave transmission lines 102 can have a thickness (e.g., along the "Y" axis shown in FIG. 1) ranging from, for example, greater than or equal to 3 micrometers (μm) and less than or equal to 20 μm. In various embodiments, the one or more microwave transmission lines 102 can be positioned on a dielectric substrate 114. In one or more embodiments, the one or more optical waveguides 104 can comprise one or more transparent, and/or substantially transparent, materials. Example materials that can be comprised within the one or more optical waveguides 104 can include, but are not limited to: silicon germanium, lithium niobate, aluminum nitride, a combination thereof, and/or the like. The one or more optical waveguides 104 can have a thickness (e.g., along the "Y" axis shown in FIG. 1) ranging from, for example, greater than or equal to 1 μm and less than or equal to 10 μm. In various embodiments, the one or optical waveguides 104 can be positioned within the dielectric substrate 114.

The dielectric substrate 114 can be crystalline, semi-crystalline, microcrystalline, or amorphous. The dielectric substrate 114 can comprise essentially (e.g., except for contaminants) a single element (e.g., silicon or germanium) and/or a compound (e.g., aluminum oxide, silicon dioxide, gallium arsenide, silicon carbide, silicon germanium, a combination thereof, and/or the like). The dielectric substrate 114 can also have multiple material layers, such as, but not limited to: a semiconductor-on-insulator substrate ("SeOI"), a silicon-on-insulator substrate ("SOI"), germanium-on-insulator substrate ("GeOI"), silicon-germanium-on-insulator substrate ("SGOI"), a combination thereof, and/or the like. Additionally, the dielectric substrate 114 can also have other layers, such as oxides with high dielectric constants ("high-K oxides") and/or nitrides. In one or more embodiments, the dielectric substrate 114 can be a silicon wafer. In various embodiments, the dielectric substrate 114 can comprise a single crystal silicon (Si), silicon germanium (e.g., characterized by the chemical formula SiGe), a Group III-V semiconductor wafer or surface/active layer, sapphire, garnet, a combination thereof, and/or the like.

As shown in FIG. 1, one or more microwave resonators 116 can be positioned adjacent to the one or more microwave transmission lines 102 and/or between the single microwave photon input section 106 and the single microwave photon output section 108. In one or more embodiments, the one or more microwave resonators 116 can comprise one or more superconducting waveguides 118 and one or more superconducting ground planes 119. The one or more superconducting waveguides 118 can comprise one or more superconducting materials. Example superconducting materials that can be comprised within the one or more superconducting waveguides 118 can include, but are not limited to: niobium, niobium nitride, titanium nitride, tantalum, tantalum nitride, aluminum, a combination thereof, and/or the like. The one or more superconducting ground planes 119 can also comprise one or more superconducting materials. Example superconducting materials that can be comprised within the one or more superconducting waveguides 118 can include, but are not limited to: niobium, niobium nitride, titanium nitride, tantalum, tantalum nitride, aluminum, a combination thereof, and/or the like. In various embodiments, the one or more superconducting waveguides 118 are comprised of a different superconducting material than the one or more superconducting ground planes 119. For instance, the one or more superconducting waveguides 118 can have a first material composition, while the one or more superconducting ground planes 119 can have a second material composition; where the first material composition can be distinct (e.g., different) than the second material composition.

For example, the one or more superconducting waveguides 118 can have a different work function than the one or more superconducting ground planes 119. Table 1 includes the critical temperature ($T_c$) and work function (W) of example superconducting materials that can be included in the one or more superconducting waveguides 118 and/or superconducting ground planes 119. In one or more or more embodiments, the superconducting materials for the one or more superconducting waveguides 118 and/or superconducting ground planes 119 can be selected such that: the one or more superconducting waveguides 118 comprise a different superconducting material than the one or more superconducting ground planes 119; a difference between the work function of the one or more superconducting waveguides 118 and the one or more superconducting ground planes is greater than or equal to 0.2 eV; and/or the critical temperature of both the superconducting waveguide 118 and the superconducting ground plane 119 exceeding 4 K. For example, the one or more superconducting waveguides 118 can comprise niobium nitride and the one or more superconducting ground planes 119 can comprise niobium nitride.

TABLE 1

| Superconductor | $T_c$ (Kelvin) | Work Function (Joules) |
| --- | --- | --- |
| Niobium (Nb) | 9.3 | 4.2 |
| Niobium Nitride (NbN) | 16 | 4.7 |
| Titanium Nitride (TiN) | 5.6 | 4.5 |
| Tantalum (Ta) | 4.5 | 4.1 |
| Tantalum Nitride (Ta) | 8 | 4.5 |
| Aluminum | 1.2 | 4.08 |

In various embodiments, the one or more superconducting waveguides 118 and/or superconducting ground planes 119 can be positioned on the dielectric substrate 114. In some examples, the one or more superconducting waveguides 118 can be positioned adjacent to a first surface of the dielectric substrate 114, and the one or more superconducting ground planes 119 can be positioned adjacent to a second surface of the dielectric substrate 114 (e.g., where the first surface of the dielectric substrate 114 is opposite the second surface of the dielectric substrate 114). In one or more embodiments, the one or more superconducting waveguides 118 can be spaced from the one or more microwave transmission lines 102 by at least a first distance D1 ranging from, for example, greater than or equal to 1 μm and less than or equal to 100 μm.

Additionally, the one or more superconducting waveguides 118 and superconducting ground planes 119 can be electrically coupled to one or more DC voltage supplies (e.g., to facilitate one or more applied voltages represented by "V" in FIG. 1). In various embodiments, the DC voltage supply can be employed to render one or more optical resonators 120 effective $\chi^{(2)}$ tensors. For example, the effective $\chi^{(2)}$ ("$\chi_{effective}^{(2)}$") can be proportional to the applied DC electric field ("$E_{DC}$") in the one or more superconducting waveguides 118 in accordance with Equation 1 below.

$$\chi_{effective}^{(2)} = 12\chi^{(3)} E_{DC} \quad (1)$$

Also shown in FIG. 1, one or more optical resonators 120 can be positioned adjacent to the one or more optical waveguides 104 and/or between the single optical photon input section 110 and single optical photon output 112. In one or more embodiments, the one or more optical resonators 120 can comprise one or more transparent, and/or substantially transparent, materials. Example materials that can be comprised within the one or more optical resonators 120 can include, but are not limited to: silicon germanium, lithium niobate, aluminum nitride, a combination thereof, and/or the like. In various embodiments, the one or more optical resonators 120 can be a $\chi^{(3)}$ non-linear optical medium. For example, the one or more optical resonators 120 can be an epitaxial growth formed from the dielectric substrate 114 via one or more epitaxial growth processes. For instance, the dielectric substrate 114 can be silicon and the one or more optical resonators 120 can comprise silicon germanium (e.g., characterized by $Si_{1-x}Ge_x$, where x can be greater than or equal to 0.10 and less than or equal to 0.30).

Further, the one or more optical resonators 120 can be arranged with the dielectric substrate 114. For example, the one or more optical resonators 120 can be positioned partially or entirely within the dielectric substrate 114. Additionally, the one or more optical resonators 120 can be spaced from the one or more optical waveguides 104 by at least a second distance D2 ranging from, for example, greater than or equal to 100 nanometers (nm) and less than or equal to 2 μm.

While FIG. 1 depicts the one or more superconducting waveguides 118 and/or optical resonators 120 having circular geometries, the architecture of the quantum transducer 100 is not so limited. For example, embodiments in which the one or more superconducting waveguides 118, superconducting ground planes 119, and/or optical resonators 120 have alternate geometries (e.g., elliptical or polygonal geometries) are also envisaged. Further, while FIG. 1 depicts the one or more superconducting waveguides 118 and optical resonators 120 misaligned with each other, the architecture of the quantum transducer 100 is not so limited. For example, embodiments in which the one or more superconducting waveguides 118 and optical resonators 120 are aligned with each other are also envisaged (e.g., as described later herein).

Figure 2:
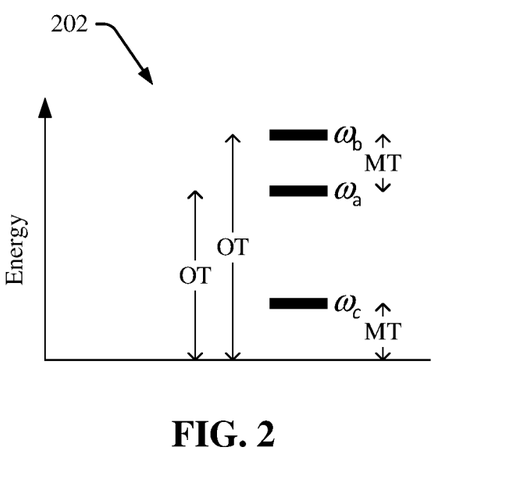
FIG. 2 illustrates a diagram of an example, non-limiting graph of optical and/or microwave transitions that can characterize operation of one or more quantum transducers in accordance with one or more embodiments described herein.

FIG. 2 illustrates a diagram of an example, non-limiting graph 202 that can depict optical and/or microwave transitions that can be experienced by the one or more quantum transducers 100 in accordance with one or more embodiments described herein. Repetitive description of like elements employed in other embodiments described herein is omitted for the sake of brevity. Graph 202 can depict optical transitions (e.g., represented by "OT" arrows) that can be experienced by the quantum transducer 100 as the energy state of the one or more microwave resonators 116 and/or optical resonators 120 increases. Also, graph 202 can depict microwave transitions (e.g., represented by "MT" arrows) that can be experienced by the quantum transducer 100 as the energy state of the one or more microwave resonators 116 and/or optical resonators 120 increases. "$\omega_a$" can represent a first optical mode of the optical resonator 120, "$\omega_b$" can represent a second optical mode of the optical resonator 120, and "$\omega_c$" can represent a microwave mode of the microwave resonator 116. In various embodiments, the one or more microwave resonators 116 and/or optical resonators 120 can satisfy a triple resonance condition characterized by Equation 2 below:

$$\omega_c = \omega_b - \omega_a \quad (2)$$

Figure 3:
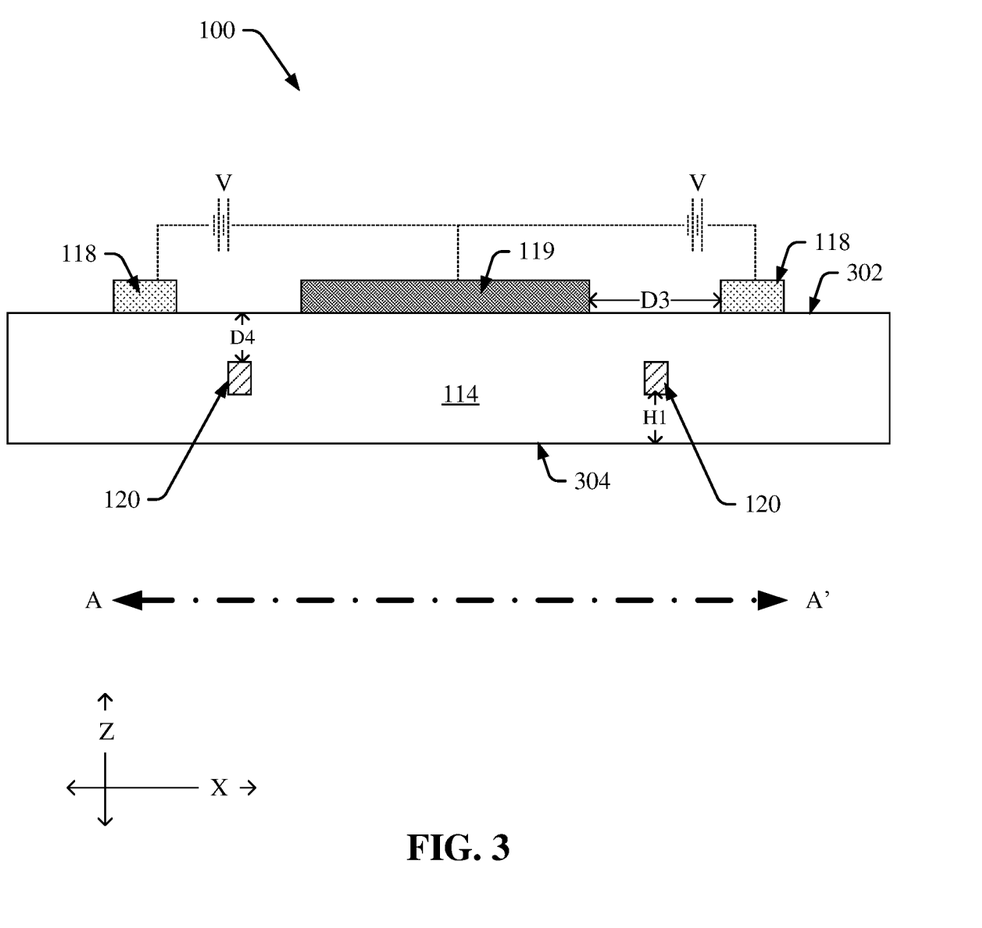
FIGS. 3-4 illustrate diagrams of example, non-limiting cross-sectional views of one or more quantum transducers having a co-planar waveguide architecture in accordance with one or more embodiments described herein.

FIG. 3 illustrate diagrams of example, non-limiting cross-sectionals view of the quantum transducer 100 in accordance with one or more embodiments described herein. Repetitive description of like elements employed in other embodiments described herein is omitted for the sake of brevity. FIG. 3 can depict a cross-section of the quantum transducer 100 along the A-A' plane depicted in FIG. 1. As shown in FIG. 3, the one or more microwave resonators 116 can include the one or more superconducting waveguides 118 and superconducting ground planes 119 positioned on a first surface 302 of the dielectric substrate 114. Thereby, the one or more microwave resonators 116 can have a co-planar waveguide ("CPW") architecture (e.g., as shown in FIG. 3).

In one or more embodiments, the one or more superconducting waveguides 118 and/or superconducting ground planes 119 can have a thickness (e.g., along the "Z" axis shown in FIG. 3) ranging from, for example, greater than or equal to 50 nm and less than or equal to 5 μm. As shown in FIG. 3, the one or more superconducting ground planes 119 can be positioned on the dielectric substrate 114 adjacent to the one or more superconducting waveguides 118. As shown in FIG. 3, the dielectric substrate 114 can house the one or more optical resonators 120. The one or more superconducting waveguides 118 can be positioned on the first surface 302 of the dielectric substrate 114.

The one or more superconducting ground planes 119 can be horizontally spaced (e.g., along the "X" axis shown in FIG. 3) from the one or more superconducting waveguides 118 by a distance D3 ranging from, for example, greater than or equal to 2 μm and less than or equal to 20 μm (e.g., 10 μm). As shown in FIG. 3, the one or more optical resonators 120 can be positioned offset from the one or more superconducting waveguides 118 along the vertical plane (e.g., along the "Z" axis shown in FIG. 3).

In one or more embodiments, the width (e.g., along the "X" axis shown in FIG. 3) of the one or more superconducting waveguides 118 can range from, for example, greater than or equal to 3 μm and less than or equal to 20 μm (e.g., 4 micrometers (μm)). Also, the width (e.g., along the "X" axis shown in FIG. 3) of the one or more superconducting ground planes 119 can range from, for example, greater than or equal to 3 μm and less than or equal to 20 μm (e.g., 10 micrometers (μm)). Further, the width (e.g., along the "X" axis shown in FIG. 3) of the one or more optical resonators 120 can range from, for example, greater than or equal to 1 μm and less than or equal to 10 μm (e.g., 3 μm).

In one or more embodiments, a thickness (e.g., along the "Z" axis shown in FIG. 3) of the one or more superconducting waveguides 118 can be greater than a thickness (e.g., along the "Z" axis shown in FIG. 3) of the one or more optical resonators 120. In one or more embodiments, the thickness of the one or more superconducting waveguides 118 and/or optical resonators 120 can be equal (e.g., as shown in FIG. 3). The thickness (e.g., along the "Z" axis shown in FIG. 3) of the one or more superconducting waveguides 118 can range from, for example, greater than or equal to 50 nm and less than or equal to 5 μm. The thickness (e.g., along the "Z" axis shown in FIG. 3) of the one or more optical resonators 120 can range from, for example, greater than or equal to 100 nm and less than or equal to 1 μm (e.g., 0.5 μm).

In various embodiments, the one or more optical resonators 120 can be positioned within the dielectric substrate 114 at a height H1 from a second surface 304 of the dielectric substrate 114 ranging from, for example, greater than or equal to 1 μm and less than or equal to 10 μm (e.g., 10 μm). Additionally, the one or more optical resonators 120 can be vertically spaced (e.g., along the "Z" axis shown in FIG. 2) from the first surface 302 by a fourth distance D4 ranging from, for example, greater than or equal to 1 and less than or equal to 10 μm (e.g., 9.5 μm).

Figure 4:
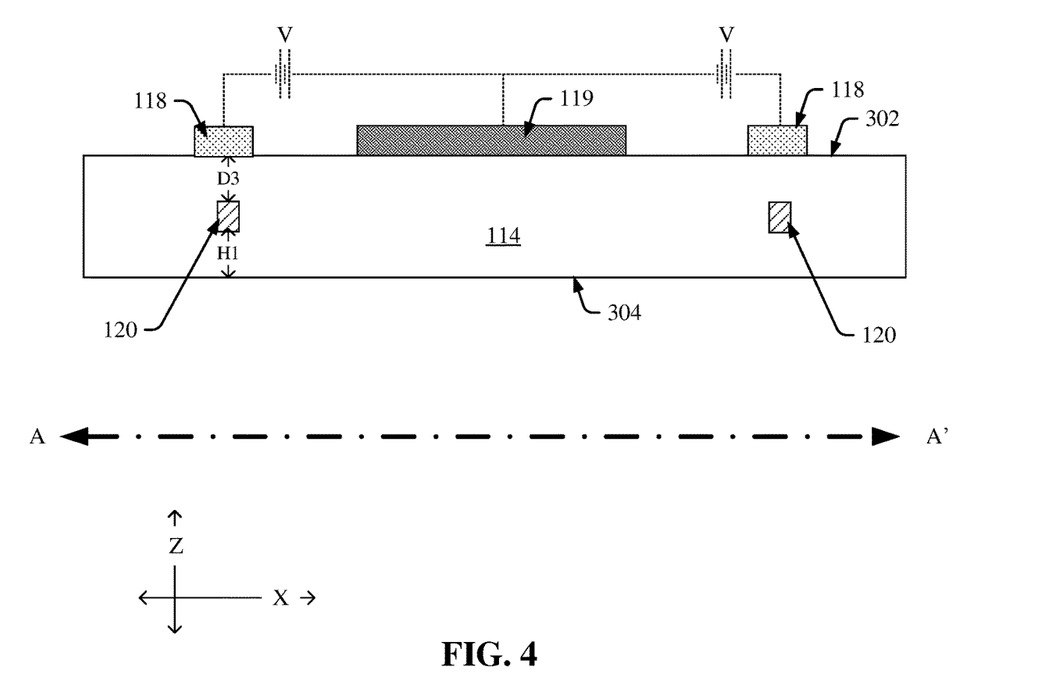

FIG. 4 illustrate diagrams of example, non-limiting cross-sectionals view of the quantum transducer 100 in accordance with one or more embodiments described herein. Repetitive description of like elements employed in other embodiments described herein is omitted for the sake of brevity. FIG. 4 can depict a cross-section of the quantum transducer 100 along the A-A' plane depicted in FIG. 1. As shown in FIG. 4, the one or more optical resonators 120 can be positioned directly below the one or more superconducting waveguides 118 (e.g., the one or more optical resonators 120 can be vertically aligned, along the "Z" axis, with the one or more superconducting waveguides 118). Also, in one or more embodiments a width (e.g., along the "X" axis shown in FIG. 3) of the one or more superconducting waveguides 118 can be greater than a width (e.g., along the "X" axis shown in FIG. 3) of the one or more optical resonators 120 (e.g., as shown in FIG. 2). In one or more embodiments, the widths of the one or more superconducting waveguides 118 and/or optical resonators 120 can be equal.

Figure 5:
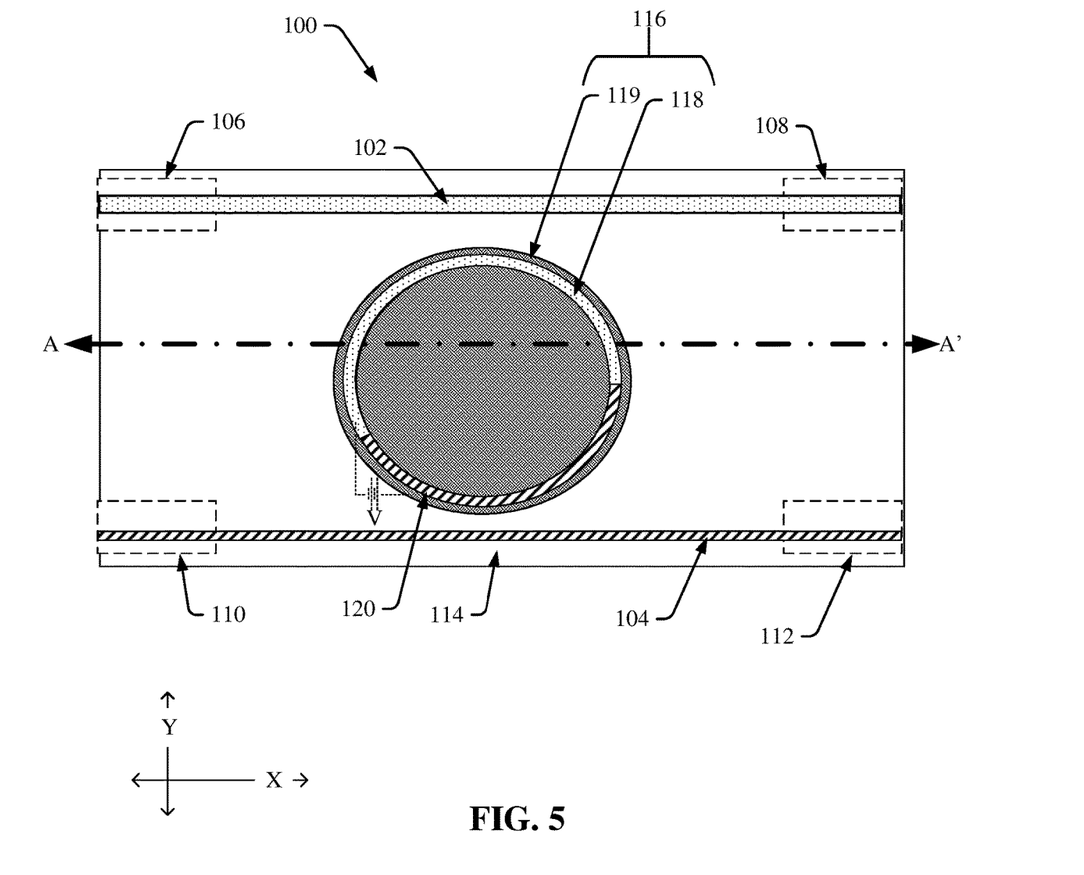
FIG. 5 illustrates a diagram of an example, non-limiting top-down view of a quantum transducer in accordance with one or more embodiments described herein.

FIG. 5 illustrates another diagram of an example, non-limiting top-down view of the exemplary quantum transducer 100 in accordance with one or more embodiments described herein. Repetitive description of like elements employed in other embodiments described herein is omitted for the sake of brevity. In various embodiments, the superconducting microwave resonator 116 can have a microstrip architecture. For example, the one or more superconducting ground planes 119 can be positioned below the one or more optical resonators 120. Thereby, the one or more optical resonators 120 can be positioned between the one or more superconducting waveguides 118 and the one or more superconducting ground planes 119.

Figure 6:
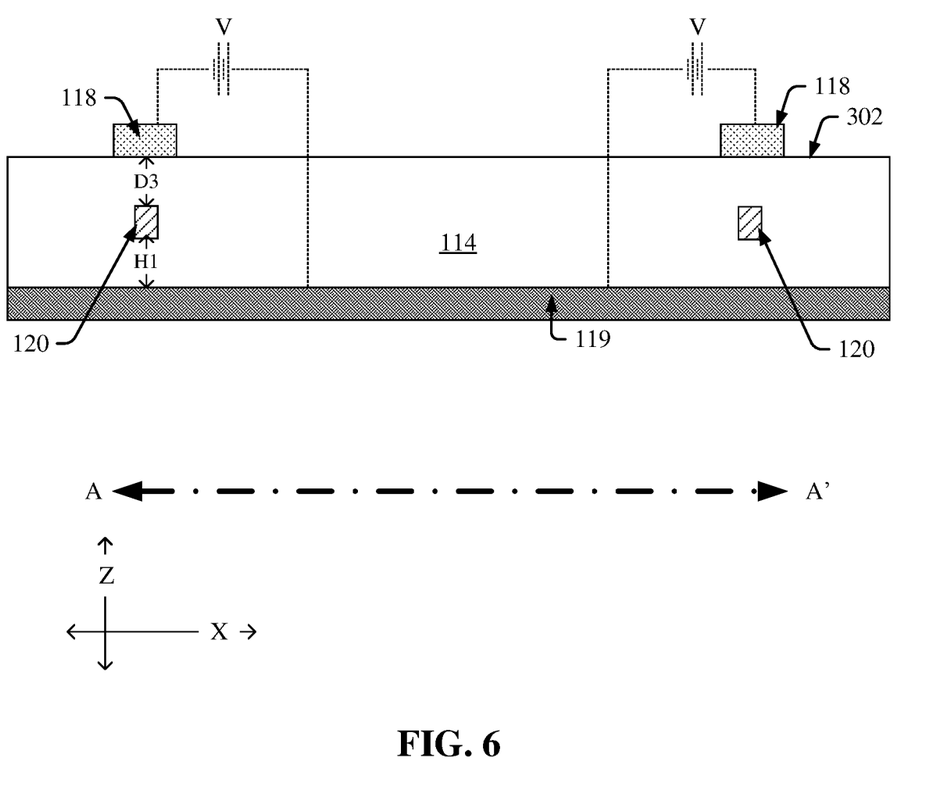
FIG. 6 illustrates a diagram of an example, non-limiting cross-sectional views of one or more quantum transducers having a microstrip architecture in accordance with one or more embodiments described herein.

FIG. 6 illustrates a diagram of an example, non-limiting cross-sectional view of the quantum transducer 100 in accordance with one or more embodiments described herein. Repetitive description of like elements employed in other embodiments described herein is omitted for the sake of brevity. FIG. 6 can depict a cross-section of the quantum transducer 100 along the A-A' plane depicted in FIG. 5. As shown in FIG. 6, the one or more microwave resonators 116 can include the one or more superconducting waveguides 118 and superconducting ground planes 119, separated from each other by the dielectric substrate 114. Thereby, the one or more microwave resonators 116 can have a microstrip architecture (e.g., as shown in FIG. 6).

In various embodiments, the one or more superconducting waveguides 118 can be positioned on the dielectric substrate 114, while the one or more optical resonators 120 can be positioned within the dielectric substrate 114. Thereby, the one or more superconducting waveguides 118 can be positioned above the one or more optical resonators 120 (e.g., along the "Z" axis depicted in FIG. 6). For example, the position of the one or more superconducting waveguides 118 can overlap the position of the one or more optical resonators 120 along a vertical plane (e.g., along the "Z" axis shown in FIG. 6). Further, the one or more superconducting ground planes 119 can be positioned at the second surface 304 the dielectric substrate 114. Further, the first surface 302 and the second surface 304 can be at opposite sides of the dielectric substrate 114.

Figure 7:
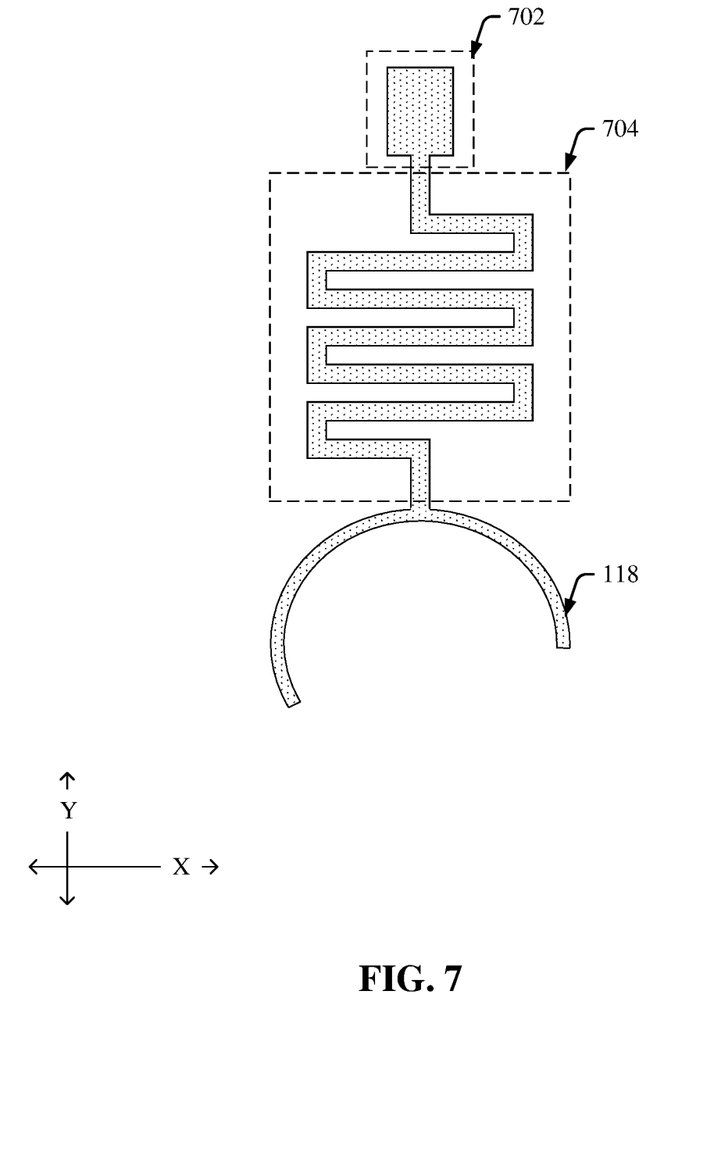
FIG. 7 illustrates a diagram of an example, non-limiting top-down view of an electrical connection operably coupled to one or more microwave resonators in accordance with one or more embodiments described herein.

FIG. 7 illustrates a diagram of the example, non-limiting quantum transducer 100 in which the one or more superconducting waveguides 118 can be electrically coupled to one or more DC voltage supplies. Repetitive description of like elements employed in other embodiments described herein is omitted for the sake of brevity. In various embodiments, the one or more superconducting waveguides 118 and/or superconducting ground planes 119 can be electrically coupled to one or more voltage nodes 702 via an inductor 704, where the inductor 704 can serve as a high pass filter that isolates the DC voltage from the microwave signal in the microwave resonator 116. For instance, the voltage node 702 and/or the inductor 704 can comprise a superconducting material (e.g., can have the same, or substantially the same, composition as the one or more superconducting waveguides 118). As shown in FIG. 7, the inductor 704 can be connected to the midpoint of the superconducting waveguide 118 (e.g., where the inductor 704 is a λ/2-type resonator) to minimize interference with the microwave resonator 116.

Figure 8:
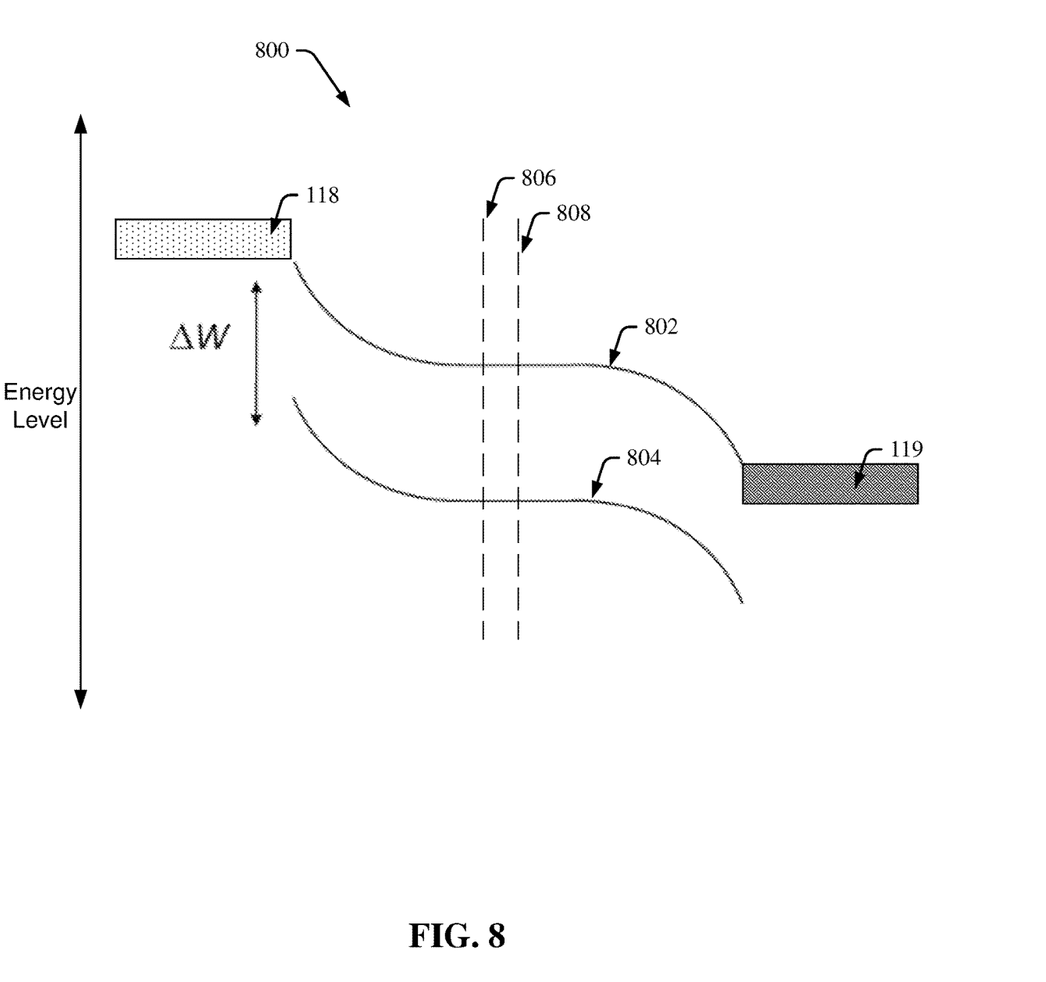
FIG. 8 illustrates a diagram of an example, non-limiting energy level diagram that can characterize a quantum transducer that comprises a dual superconductor microwave resonator during zero applied voltage in accordance with one or more embodiments described herein.

FIG. 8 illustrates a diagram of an example, non-limiting energy level diagram 800 that can characterize the superconductor-dielectric-superconductor junction of the quantum transducer 100 in accordance with one or more embodiments described herein. Repetitive description of like elements employed in other embodiments described herein is omitted for the sake of brevity. Energy level diagram 800 characterizes the quantum transducer 100 where a voltage applied to the microwave resonator 116 (e.g., via the one or more DC voltage supplies) is zero. Further, energy level diagram 800 depicts the valence band 802 and the conduction band 804 in the optical resonator 120. The vertical axis of energy level diagram 800 corresponds to energy, and the slope of the valence band 802 and conduction band 804 can correspond to the electric field in the optical resonator 120. Additionally, the bounds of the two back-to-back Schottky barriers 806, 808 can be delineated by dashed lines in the energy level diagram 800.

As described herein, the one or more superconducting waveguides 118 and the one or more superconducting ground planes 119 can have different work functions, where the difference between the respective work functions can be represented by ΔW in the energy level diagram 800. At least due to the differing work functions, the valence band 802 and the conduction band 804 within the first superconductor-dielectric junction can bend in a first direction (e.g., can bend up); whereas the valence band 802 and the conduction band 804 within the second superconductor-dielectric junction can bend in a separate direction (e.g., can bend down). Thereby, the work function difference can cause the valence band 802 and conduction band 804 to bend in opposite directions, even when zero voltage is applied (e.g., at least because the one or more superconducting waveguides 118 and superconducting ground planes 119 have different energy levels when zero voltage is applied).

Figure 9:
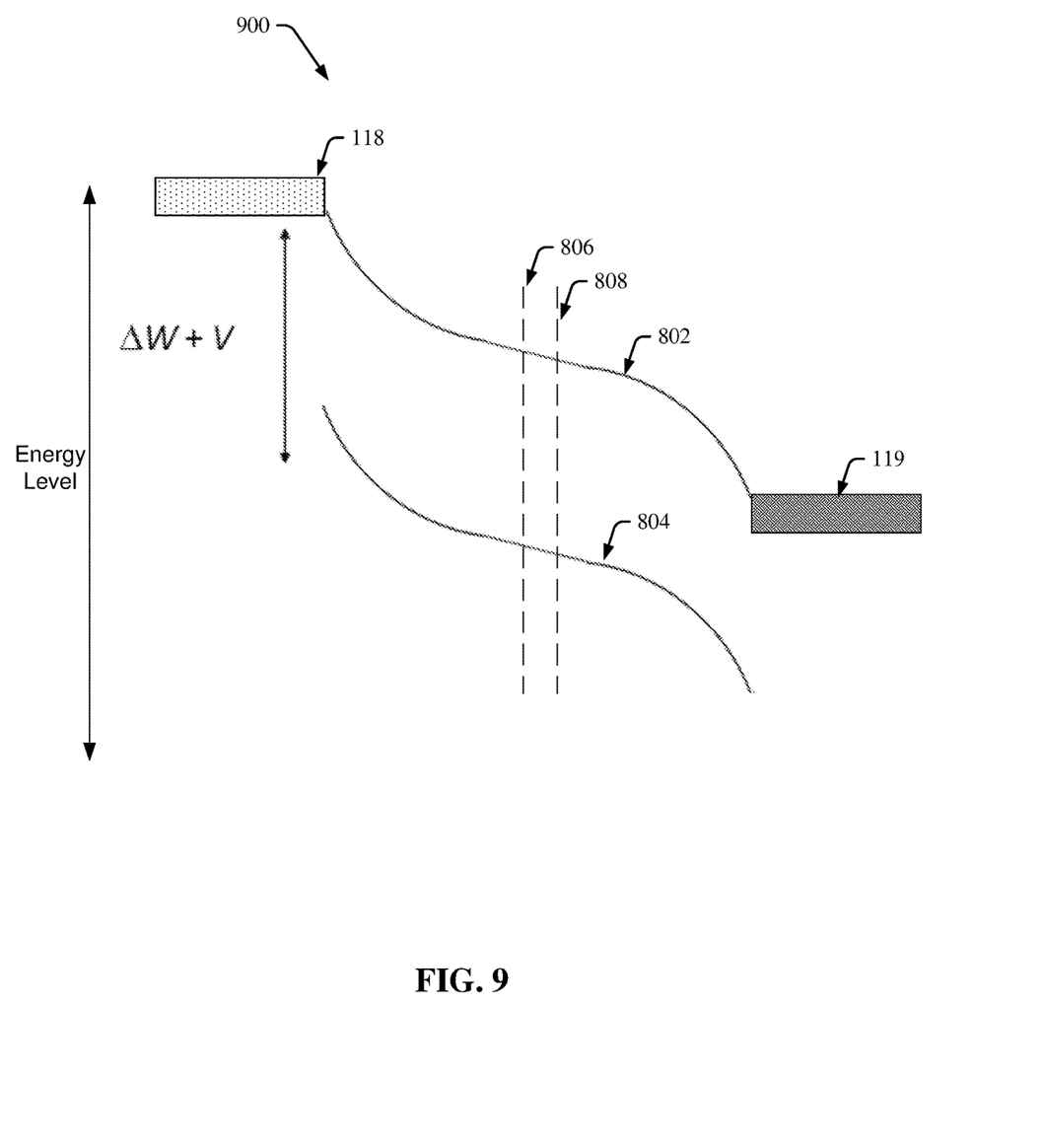
FIG. 9 illustrates a diagram of an example, non-limiting energy level diagram that can characterize a quantum transducer that comprises a dual superconductor microwave resonator during an applied voltage in accordance with one or more embodiments described herein.

FIG. 9 illustrates a diagram of an example, non-limiting energy level diagram 900 that can characterize the superconductor-dielectric-superconductor junction of the quantum transducer 100 in accordance with one or more embodiments described herein. Repetitive description of like elements employed in other embodiments described herein is omitted for the sake of brevity. Energy level diagram 900 characterizes the quantum transducer 100 where a voltage V applied to the microwave resonator 116 (e.g., via the one or more DC voltage supplies) is greater than zero. Additionally, the microwave resonator 116 characterized by energy level diagram 900 can have the same work function difference ΔW as the microwave resonator 116 characterized by energy level diagram 800.

As shown in energy level diagram 900, a difference in the energy level between the valence band 802 and the conduction band 804 can be a function of the applied voltage V and the work function difference ΔW. Due to the opposite bends in the valence band 802 and conduction band 804 created by the work function difference ΔW, the applied voltage can reverse bias both superconductor-dielectric junctions of the quantum transducer 100 (e.g., both superconductor-dielectric junctions can be simultaneously reverse biased). Thereby, the energy level difference between the valence band 802 and the conduction band 804 can increase when the applied voltage is greater than zero. As a result, the various embodiments described herein can enable a larger range of voltage to be applied to the microwave resonator 116 (e.g., as compared to typical architectures) before current gets transported through the junction.

For example, if the two superconductor-dielectric junctions comprise the same superconducting material, the one or more superconducting waveguides 118 and superconducting ground planes 119 would have the same energy level when zero voltage is applied. Thus, the valence band 802 and the conduction band 804 would bend in the same direction in both the first superconductor-dielectric junction and the second superconductor-dielectric junction. Thereby, applying a voltage greater than zero to the microwave resonator 116 would result in a forward bias of one of the superconductor-dielectric junctions, where the energy difference between the valence band 802 and the conduction band 804 would narrow (e.g., rather than widen, as in a reverse bias). As such, a voltage range that could be applied to the microwave resonator 116 without transporting current through the junction would be restricted, as compared to the various embodiments described herein.

Figure 10:
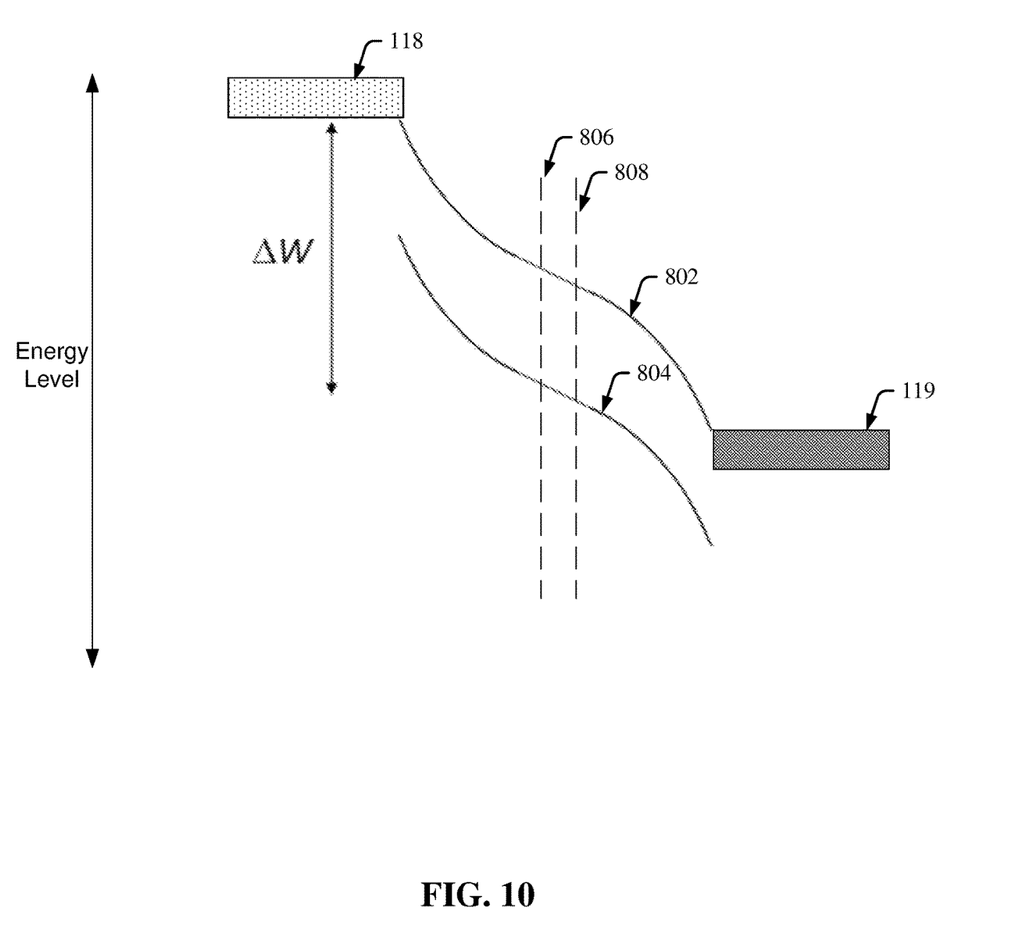
FIG. 10 illustrates a diagram of an example, non-limiting energy level diagram that can characterize a quantum transducer that comprises a dual superconductor microwave resonator during zero applied voltage in accordance with one or more embodiments described herein.

FIG. 10 illustrates a diagram of an example, non-limiting energy level diagram 1000 that can characterize the superconductor-dielectric-superconductor junction of the quantum transducer 100 in accordance with one or more embodiments described herein. Repetitive description of like elements employed in other embodiments described herein is omitted for the sake of brevity. Energy level diagram 1000 characterizes the quantum transducer 100 where a voltage applied to the microwave resonator 116 (e.g., via the one or more DC voltage supplies) is zero. As shown in energy level diagram 1000, in various embodiments the work function difference ΔW between the one or more superconducting waveguides 118 and superconducting ground planes 119 can be large enough to establish a non-zero electrical field across the optical resonator 120 even when zero voltage is applied. For example, once the work function difference ΔW is high enough that the Schottky barrier width extends to the optical resonator 120 region, the slope of the valence band 802 and conduction band 804 (e.g., which characterizes the electrical field across the optical resonator 120) at zero applied voltage can mirror and/or resemble the slope of the valence band 802 and conduction band 804 at an applied voltage greater than zero.

For instance, the work function difference ΔW between the superconducting waveguide 118 and superconducting ground plane 119 of the quantum transducer 100 characterized by energy level diagram 1000 can be greater than the work function difference ΔW between the superconducting waveguide 118 and superconducting ground plane 119 of the quantum transducer 100 characterized by energy level diagram 800. Both energy level diagram 800 and energy level diagram 1000 characterize quantum transducers 100 in which zero voltage is applied. However, the variance in the work function difference ΔW between energy level diagram 800 and energy level diagram 1000 can result in different slopes to the valence bands 802 and conduction bands 804 of the diagrams; thereby, indicating the achievement of different electrical fields in the optical resonator 120. For example, the slope of the valence band 802 and conduction band 804 of energy level diagram 1000 is greater than the slope of the valence band 802 and conduction band 804. A comparison of energy level diagram 1000 to energy level diagram 900 can illustrate that the slope of the valence band 802 and conduction band 804 of energy level diagram 1000 is more akin to a slope exhibited when a voltage greater than zero is applied to a quantum transducer 100 having the lower work function difference ΔW.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

It is, of course, not possible to describe every conceivable combination of components, products and/or methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
   a superconducting microwave resonator having a microstrip architecture that includes a dielectric substrate positioned between a superconducting waveguide and a superconducting ground plane, wherein the superconducting waveguide has a first material composition, and wherein the superconducting ground plane has a second material composition that is distinct from the first material composition, and wherein the superconducting waveguide and the superconducting ground plane are operatively connected to a voltage supply to create an electric field across the dielectric substrate; and
   an optical resonator arranged with the dielectric substrate.

2. The apparatus of claim 1, wherein the superconducting waveguide comprises a first element selected from a first group consisting of niobium, niobium nitride, titanium nitride, tantalum, tantalum nitride, and aluminum, and wherein the superconducting waveguide comprises a second element selected from the first group.

3. The apparatus of claim 2, wherein the superconducting waveguide comprises niobium nitride and the superconducting ground plane comprises niobium.

4. The apparatus of claim 2, wherein the dielectric substrate comprises at least one element selected from the group consisting of silicon, sapphire, and garnet.

5. The apparatus of claim 1, wherein the dielectric substrate is positioned between the superconducting waveguide and the optical resonator, and wherein the dielectric substrate is further positioned between the superconducting ground plane and the optical resonator.

6. The apparatus of claim 1, wherein the superconducting waveguide and the superconducting ground plane are electrically connected to a direct current voltage supply.

7. The apparatus of claim 6, wherein the superconducting waveguide is electrically connected to the direct current voltage supply via a high pass filter.

8. An apparatus comprising:
   a superconducting microwave resonator having a coplanar waveguide architecture that includes a superconducting waveguide and a superconducting ground plane positioned on a dielectric substrate, wherein the superconducting waveguide has a first material composition, and wherein the superconducting ground plane has a second material composition that is distinct from the first material composition; and
   an optical resonator arranged with the dielectric substrate.

9. The apparatus of claim 8, wherein the superconducting waveguide comprises a first element selected from a first group consisting of niobium, niobium nitride, titanium nitride, tantalum, tantalum nitride, and aluminum, and wherein the superconducting waveguide comprises a second element selected from the first group.

10. The apparatus of claim 9, wherein the superconducting waveguide comprises niobium nitride and the superconducting ground plane comprises niobium.

11. The apparatus of claim 9, wherein the dielectric substrate comprises at least one element selected from the group consisting of silicon, sapphire, and garnet.

12. The apparatus of claim 8, wherein the dielectric substrate is positioned between the superconducting waveguide and the optical resonator.

13. The apparatus of claim 8, wherein the superconducting waveguide and the superconducting ground plane are electrically connected to a direct current voltage supply.

14. The apparatus of claim 13, wherein the superconducting waveguide is electrically connected to the direct current voltage supply via a high pass filter.

15. An apparatus comprising:
    a superconducting microwave resonator that includes a superconducting waveguide and a superconducting ground plane, wherein the superconducting waveguide has a first work function, and wherein the superconducting ground plane has a second work function that is distinct from the first work function; and
    an optical resonator arranged with a dielectric substrate, wherein the dielectric substrate is positioned between the optical resonator and the superconducting waveguide.

16. The apparatus of claim 15, wherein the superconducting waveguide comprises a first element selected from a first group consisting of niobium, niobium nitride, titanium nitride, tantalum, tantalum nitride, and aluminum, and wherein the superconducting waveguide comprises a second element selected from the first group.

17. The apparatus of claim 15, wherein the superconducting waveguide comprises niobium nitride and the superconducting ground plane comprises niobium.

18. The apparatus of claim 16, wherein the dielectric substrate comprises at least one element selected from the group consisting of silicon, sapphire, and garnet.

19. The apparatus of claim 15, wherein the dielectric substrate is further positioned between the superconducting ground plane and the optical resonator.

20. The apparatus of claim 15, wherein the superconducting waveguide and the superconducting ground plane are electrically connected to a direct current voltage supply.

* * * * *